United States Patent
Glanzer et al.

(10) Patent No.: US 12,301,222 B2
(45) Date of Patent: May 13, 2025

(54) SEMICONDUCTOR SWITCH CONTROLLER

(71) Applicant: Infineon Technologies AG, Neubiberg (DE)

(72) Inventors: Christof Marc Glanzer, Villach (AT); Christian Djelassi-Tscheck, Villach (AT); Markus Ladurner, Villach (AT); Alexander Mayer, Treffen (AT)

(73) Assignee: Infineon Technologies AG, Neubiberg (DE)

(*) Notice: Subject to any disclaimer, the term of this patent is extended or adjusted under 35 U.S.C. 154(b) by 44 days.

(21) Appl. No.: 18/334,591

(22) Filed: Jun. 14, 2023

(65) Prior Publication Data

US 2023/0412168 A1 Dec. 21, 2023

(30) Foreign Application Priority Data

Jun. 15, 2022 (DE) .................. 102022115103.4

(51) Int. Cl.
*H03K 17/18* (2006.01)
*H03K 17/14* (2006.01)
*H03K 17/22* (2006.01)

(52) U.S. Cl.
CPC ......... *H03K 17/223* (2013.01); *H03K 17/145* (2013.01); *H03K 17/18* (2013.01)

(58) Field of Classification Search
CPC .... H03K 17/223; H03K 17/145; H03K 17/18; H03K 17/0822; H03K 17/284
See application file for complete search history.

(56) References Cited

U.S. PATENT DOCUMENTS

| | | | | |
|---|---|---|---|---|
| 2020/0313544 | A1* | 10/2020 | Ying | H02M 1/32 |
| 2021/0091653 | A1* | 3/2021 | He | H02M 1/00 |
| 2022/0231531 | A1* | 7/2022 | Wiggins | H02J 7/00036 |
| 2024/0314900 | A1* | 9/2024 | Wu | H05B 45/14 |

FOREIGN PATENT DOCUMENTS

| | | |
|---|---|---|
| DE | 102017122144 A1 | 3/2018 |
| DE | 102020123149 A1 | 3/2022 |

OTHER PUBLICATIONS

Mocevic, Slavko et al. "Comparison and Discussion on Shortcircuit Protections for Silicon-Carbide MOSFET Modules: Desaturation Versus Rogowski Switch-Current Sensor" IEEE Transactions on Industry Applications, vol. 56, No. 3, May/Jun. 2020, pp. 2880-2893.

\* cited by examiner

Primary Examiner — Sibin Chen
(74) Attorney, Agent, or Firm — Slater Matsil, LLP

(57) ABSTRACT

A circuit arrangement for driving a semiconductor switch includes an undervoltage detection circuit to indicate an undervoltage state when a supply voltage falls below a voltage threshold value. A temperature detection circuit indicates that a temperature of a semiconductor switch exceeds a temperature threshold value. A control circuit for driving the semiconductor switch deactivates the semiconductor switch when the undervoltage detection circuit indicates an undervoltage state, and to reactivate the semiconductor switch when the undervoltage detection circuit no longer indicates an undervoltage state. In this case, the reactivation is delayed by a defined delay time when the semiconductor switch was previously deactivated due to an undervoltage state and the temperature detection circuit indicates that the temperature of the semiconductor switch exceeds the temperature threshold value.

20 Claims, 2 Drawing Sheets

SEMICONDUCTOR SWITCH CONTROLLER

This application claims the benefit of German Patent Application No. 102022115103.4, filed on Jun. 15, 2022, which application is hereby incorporated herein by reference.

TECHNICAL FIELD

The present description relates to the field of electronic devices, and more particularly to a semiconductor switch controller.

BACKGROUND

As complexity in the automotive industry increases, in particular in the field of smart power distribution in cars, dealing with fault states is also becoming increasingly challenging. A short circuit of a supply line in a cable harness and the effects thereof on the supply voltage is considered as an example.

If the supply voltage drops to a low value due to a short circuit, this may lead to logic circuits for driving a MOS power transistor no longer being able to operate correctly. This state (excessively low supply voltage) is referred to as an undervoltage (UV). Known drive circuits for MOS power transistors, along with smart semiconductor switches, which may contain such drive circuits, have a function for identifying an undervoltage and for deactivating the power transistor when an undervoltage is identified.

If the undervoltage is caused by a short circuit, the supply voltage returns to the normal value following the deactivation of the MOS power transistor. As a result of this, the drive circuit will reactivate the power transistor (because an undervoltage is no longer detected), in response to which the short-circuit current is able to flow again and the supply voltage drops again, which again leads to an undervoltage and deactivation of the power transistor. The circuit begins to oscillate, which is referred to as toggling. This toggling may in theory last any amount of time, but in practice normally ends due to an overtemperature protection circuit definitively deactivating the power transistor and reporting an overtemperature fault.

Multiple power transistors or smart semiconductor switches may share a supply line on a circuit board, with each switch being assigned to an electrical load (for example a module, a subsystem, etc.). A short circuit in one of the electrical loads (or in a supply line to the load) inevitably leads to an undervoltage deactivation of all transistors that share the same supply line. In other words, a fault in one load that leads to an undervoltage also affects neighboring loads.

There are concepts that aim to prevent the abovementioned toggling, for example by the reactivation not taking place automatically when the undervoltage state is no longer present, but rather having to be prompted by an external controller. Other concepts make provision to insert a delay time before the automatic reactivation when the undervoltage state is no longer present. However, these concepts have the disadvantage that they intervene even in the case of what are known as micro-interruptions in the supply voltage (cf. automotive test standard LV124/LV148), which leads to undesirable behavior of the smart semiconductor switch.

SUMMARY

A circuit arrangement for driving a semiconductor switch is described below. According to one exemplary embodiment, the circuit arrangement has the following: an undervoltage detection circuit that is configured to indicate an undervoltage state when a supply voltage falls below a voltage threshold value; a temperature detection circuit that is configured to indicate that a temperature of a semiconductor switch exceeds a temperature threshold value; and a control circuit for driving the semiconductor switch, which control circuit is configured to deactivate the semiconductor switch when the undervoltage detection circuit indicates an undervoltage state, and to reactivate the semiconductor switch when the undervoltage detection circuit no longer indicates an undervoltage state. In this case, the reactivation is delayed by a defined delay time when the semiconductor switch was previously deactivated due to an undervoltage state and the temperature detection circuit indicates that the temperature of the semiconductor switch exceeds the temperature threshold value.

A method for driving a semiconductor switch is also described. According to one exemplary embodiment, the method comprises the following: detecting and indicating an undervoltage state when a supply voltage falls below a voltage threshold value; measuring a temperature of a semiconductor switch and signaling when the measured temperature of the semiconductor switch exceeds a temperature threshold value; deactivating the semiconductor switch when an undervoltage state is signaled, and reactivating the semiconductor switch when an undervoltage state is no longer signaled. In this case, the reactivation is (only) delayed by a defined delay time when the semiconductor switch was previously deactivated due to a detected undervoltage state and it is signaled that the temperature of the semiconductor switch exceeds the temperature threshold value.

BRIEF DESCRIPTION OF THE DRAWINGS

Exemplary embodiments are explained in more detail below with reference to drawings. The illustrations are not necessarily true to scale, and the exemplary embodiments are not restricted just to the aspects that are illustrated. Rather, value is placed on illustrating the principles underlying the exemplary embodiments. With regard to the figures.

DETAILED DESCRIPTION OF ILLUSTRATIVE EMBODIMENTS

Figure 1:
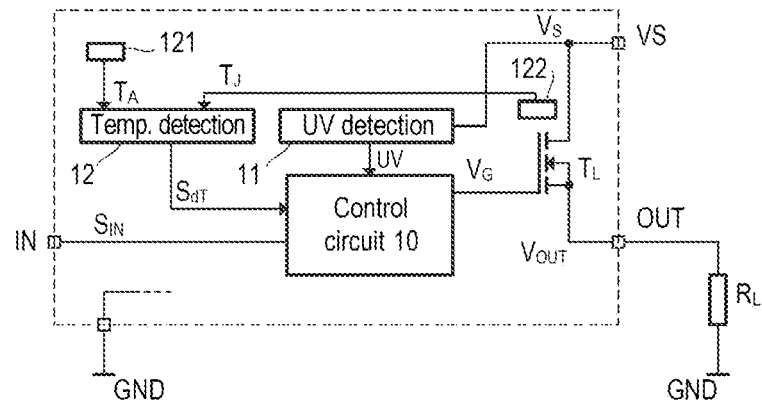
FIG. 1 illustrates one example of a circuit that may be used as a smart semiconductor switch.

FIG. 1 shows one example of a circuit arrangement that may be used as a smart semiconductor switch. The circuit arrangement contains an electronic switch $T_L$, which, in the illustrated example, is designed as a MOS (metal-oxide semiconductor) field-effect transistor. It goes without saying that, in the concepts set forth here, other types of electronic switches may also be used (for example insulated-gate bipolar transistors (IGBTs), etc.). The electronic switch (semiconductor switch) $T_L$ has a load current path, which connects a supply node (supply voltage $V_S$) to an output node OUT in a switchable manner. A load may be connected to the output node. The circuit arrangement of FIG. 1, along with some embodiments described herein, aim to distinguish between a low supply voltage due to a short circuit and a low supply voltage due to a micro-interruption.

In the present example, the semiconductor switch $T_L$ is a high-side switch, for which reason the load, which is symbolized by the resistor $R_L$ in FIG. 1, is connected between output node and a ground node GND. It goes without saying that the concepts described here may easily be transferred to low-side switches. In the case of a low-side switch, the ground node GND is a (first) supply node (ground potential $V_{GND}$) and the load is connected between the output node OUT and the other (second) supply node (supply voltage $V_S$). It goes without saying that the load is not necessarily an (ohmic) resistor. In practice, the load will often be a more complex load, such as for example a module having a multiplicity of components or a subsystem via which a multiplicity of modules is supplied.

The circuit arrangement according to FIG. 1 furthermore comprises a temperature detection circuit 12 that is configured to detect whether a temperature $T_J$ of the semiconductor switch $T_L$ exceeds a temperature threshold value. If the temperature $T_J$ exceeds the temperature threshold value, the temperature detection circuit 12 indicates this circumstance through a corresponding logic level of the signal $S_{dT}$. The temperature threshold value is not necessarily a constant value, but rather may depend on a chip temperature $T_A$ that the chip has outside the active region (that is to say the "hotspot") of the semiconductor switch. By way of example, the temperature threshold value is $T_A + \Delta T$ and the temperature detection circuit 12 detects the condition $T_J > T_A + \Delta T$, which is equivalent to $T_J - T_A > \Delta T$. The threshold value $\Delta T$ in this example is constant and corresponds to a temperature difference.

The circuit arrangement from FIG. 1 furthermore comprises temperature sensors 121 and 122. The sensor 121 is configured to generate a measured signal representing the temperature $T_A$ and the sensor 122 is configured to generate a measured signal representing the temperature $T_J$. The temperature sensor 122 may for this purpose be embedded into the active region of the semiconductor switch $T_L$. The active region is for example a transistor cell array within the semiconductor chip when the semiconductor switch $T_L$, as is routine, is formed from multiple transistor cells. Various suitable temperature sensors are known, and these are therefore not discussed in detail here. The temperature sensors 121 and 122 may have for example a p-n junction as sensor elements. In other words, diodes and bipolar transistors, inter alia, may be considered as sensor elements. The sensor signals that indicate the temperatures $T_A$ and $T_J$ are supplied to the temperature detection circuit 12, which, based on the measured temperatures and a threshold value (for example $\Delta T$), indicates a state of excessive temperature.

The circuit arrangement from FIG. 1 furthermore comprises an undervoltage detection circuit 11 that is configured to indicate an undervoltage state when the supply voltage $V_S$ falls below a voltage threshold value $V_{SUV}$. For this purpose, the undervoltage detection circuit 11 may have a comparator that compares the supply voltage $V_S$ with the threshold value $V_{SUV}$ and indicates, at its output, whether the condition $V_S < V_{SUV}$ (undervoltage condition) for an undervoltage state is met. In the illustrated example, the output signal UV from the comparator is also the output signal from the undervoltage detection circuit 11.

The semiconductor switch $T_L$ has a control electrode (the gate electrode in the case of a MOS transistor). The semiconductor switch $T_L$ is able to be activated and deactivated by driving the control electrode with an appropriate control signal (for example gate voltage $V_G$ or gate current). In the illustrated example, the control signal $V_G$ is generated by the control circuit 10. The control circuit is essentially a logic circuit to which the logic signals UV, $S_{dT}$ and $S_{IN}$, inter alia, are supplied. The signal $S_{IN}$ is an input signal that indicates whether the electronic switch $T_L$ should be activated or deactivated. The input signal $S_{IN}$ may be generated by an external controller (for example a microcontroller or another control unit) and supplied to the circuit arrangement on a dedicated chip pin IN (see FIG. 1).

As an alternative, the circuit arrangement may receive control commands with the aid of a digital communication interface. These control commands may comprise an activation command and a deactivation command, and the communication interface may be configured to generate the signal $S_{IN}$ in response to the receipt of an activation command or a deactivation command. Bus interfaces that are known per se, such as for example a serial peripheral interface (SPI) or a CAN (controller area network) interface, may be considered as digital communication interfaces. However, a large number of other bus interfaces are also suitable.

If the input signal $S_{IN}$ signals activation of the semiconductor switch $T_L$ (for example by way of a high level, $S_{IN} = 1$), then the control circuit 10, in response thereto, generates a corresponding control signal $V_G$ in order to activate the semiconductor switch $T_L$. Conversely, if the input signal $S_{IN}$ signals deactivation of the semiconductor switch $T_L$ (for example by way of a low level, $S_{IN} = 0$), then the control circuit 10, in response thereto, generates a corresponding control signal $V_G$ in order to deactivate the semiconductor switch $T_L$. The control circuit 10 may however also deactivate the semiconductor switch when a deactivation condition is met, even when the input signal $S_{IN}$ signals activation.

As mentioned at the outset, deactivation due to a detected undervoltage may lead to undesirable toggling. Known countermeasures, such as for example permanent deactivation (latch off) or the insertion of a delay time before an automatic reactivation, cause new undesirable effects, for example in the case of what are known as micro-interruptions in the supply voltage $V_S$. Micro-interruptions lead to a drop in the supply voltage for a very short time period of, for example, less than one microsecond.

According to the examples described here, the control circuit 10 is configured to distinguish between micro-interruptions in the supply voltage $V_S$ and a dip in the supply voltage due to a short circuit. After the semiconductor switch $T_L$ has been deactivated due to a detected undervoltage state ($V_S < V_{SUV}$), the semiconductor switch $T_L$ is automatically reactivated when an undervoltage state is no longer detected, wherein the reactivation is delayed by a delay time $T_{DEL}$ when the temperature detection circuit 12 indicates an increased temperature. Byway of example, a high level of the signal $S_{dT}$ may indicate an increased temperature when the condition $T_J > T_A + \Delta T$ is met. If no increased temperature is indicated (for example $S_{dT} = 0$), then the semiconductor switch $T_L$ is automatically reactivated without a delay, as soon as an undervoltage state is no longer detected.

In this connection, immediately reactivated "without a delay" means that a defined delay time is not awaited before the reactivation. Certain propagation delays due to finite switching speeds are inevitable and always naturally occur. In practice, the mentioned delay time $T_{DEL}$ may amount to a few milliseconds, and is thus several orders of magnitude greater than the typical inevitable propagation delays.

Figure 2:
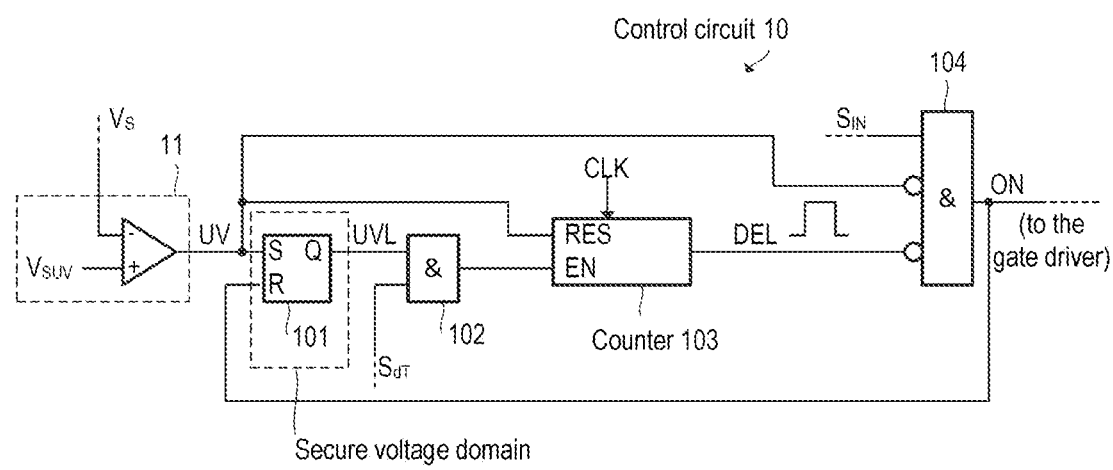
FIG. 2 illustrates one example of a control circuit for driving a semiconductor switch.

FIG. 2 illustrates one example of a control circuit for driving a semiconductor switch, and also one example of the undervoltage detection circuit 11. The components 101, 102, 103 and 104 illustrated in FIG. 2 (RS flip-flop 101, AND gate 102, counter 103 and AND gate 104) may be considered as part of the control circuit 10 shown in FIG. 1.

In the illustrated example, the undervoltage detection circuit 11 is formed by a comparator that indicates, at its output (logic signal UV), whether the supply voltage $V_S$ is smaller than the voltage threshold value $V_{SUV}$. In other exemplary embodiments, the comparator of the undervoltage detection circuit 11 may exhibit hysteresis. As mentioned, the insertion of the delay time $T_{DEL}$ before the reactivation of the semiconductor switch $T_L$ depends on whether the semiconductor switch $T_L$ was previously deactivated in response to the detection of an undervoltage. For this reason, the undervoltage state signalled by the signal UV is stored. The RS flip-flop 101, the set input of which is supplied with the signal UV, serves as storage element in the illustrated example. In other words, when an undervoltage state is detected, it is stored in the RS flip-flop 101. The flip-flop 101 is reset as soon as the semiconductor switch $T_L$ is reactivated. The output signal from the flip-flop 101 (non-inverting output Q) is denoted UVL.

Of course, in the event of an undervoltage-induced deactivation, the flip-flop 101 must not lose its stored state. For this reason, the flip-flop 101 is integrated into a "secure" voltage domain the components of which are supplied via a buffered supply voltage. The transfer between the secure voltage domain and one or more other voltage domains generally takes place using what are known as level shifters. In other words, the signal UV (set signal of the flip-flop) is transferred to the secure voltage domain by way of a level shifter and the output signal UVL from the flip-flop 101 is likewise transferred from the secure voltage domain to the other voltage domain by way of a level shifter (level shifters are not illustrated in FIG. 2). The reset signal of the flip-flop is likewise transferred to the secure voltage domain by a level shifter. Concepts regarding a secure voltage domain are known per se and are therefore not discussed further here.

In the event of a deactivated semiconductor switch, the signal UVL indicates whether the deactivation took place due to the detection of an undervoltage, regardless of whether the undervoltage state is still present. As mentioned, the delay time $T_{DEL}$ is inserted only when firstly the deactivation took place due to the detection of an undervoltage (UVL=1) and (secondly) when an increased temperature ($T_J > T_A + \Delta T$, $S_{dT} = 1$) is detected. This AND operation is implemented by the AND gate 102, which activates the counter 103 when both conditions (UVL=1 and $S_{dT}$=1) are met.

In the illustrated example, the delay time is determined by the counter 103, which receives a clock signal CLK. The clock frequency $f_{CLK}$ predefined by the clock signal CLK determines the speed at which the counter 103 counts. In the present example, it is assumed that the counter has 5 bits (counter value 0 . . . 31) and the clock signal has a frequency $f_{CLK}$ of 4 kHz. Resetting the counter 103 has the effect of the counter being set to zero. The signal UV is supplied to the reset input RES of the counter 103, meaning that the counter is reset as soon as an undervoltage (UV=1) is detected. The counting process starts when the counter 103 is activated (enable input EN sees a high level) and a high level is no longer present on the reset input RES (that is to say UV=0). The counting process stops upon an overflow, which in the present example occurs after 8 ms ($T_{DEL} = 2^b/f_{CLK}$ with b=5 bits and $f_{CLK}$=4 kHz). The output of the counter delivers a high level (signal DEL) as long as the counting process is active, that is to say from the start of the counting process up to the counter overflow.

It is pointed out at this juncture that the counter, following deactivation of the transistor $T_L$, is activated only when the deactivation took place due to the detection of an undervoltage (UVL=1) and at the same time the temperature detection circuit 12 indicates an increased (differential) temperature ($S_{dT}$=1). If one of the two conditions are not met, then the counter 103 remains inactive, the output of the counter 103 (signal DEL) remains at a low level, and the semiconductor switch $T_L$ may be reactivated without a delay.

The requirements for reactivation are checked by the AND gate 104, wherein two of the three inputs of the AND gate 104 are inverting. The input signal $S_{IN}$ is supplied to the non-inverting input. The two inverting inputs receive the signals UV and DEL. In other words, the semiconductor switch $T_L$ is able to be activated only as long as the input signal indicates activation ($S_{IN}$=1). The semiconductor switch $T_L$ may also be activated only when an undervoltage state is not (no longer) detected (UV=0) and when the counter 103 does not delay (or no longer delays) the activation (DEL=0). The output signal from the gate 104 is denoted ON. The signal ON, depending on the actual implementation, may be supplied either directly to the gate electrode of the semiconductor switch $T_L$ or indirectly via a gate driver (not illustrated in FIG. 2). In both cases, the level of the signal ON determines the switching state (on or off) of the semiconductor switch $T_L$.

The concept described here is summarized below based on a flowchart. The flowchart from FIG. 3 visualizes a method for driving an electronic switch, which may be used for example in a smart semiconductor switch. The blocks B1 to B5 illustrated in FIG. 3 do not imply any specific order and also do not rule out any additional steps. According to FIG. 3, the method comprises detecting and indicating an undervoltage state (cf. FIG. 2, condition $V_S < V_{SUV}$) when a supply voltage falls below a voltage threshold value (see FIG. 3, block B1). The method furthermore comprises measuring (sensing) a temperature of a semiconductor switch (cf. FIG. 1, MOS transistor $T_L$) and signalling that the temperature of the semiconductor switch exceeds a temperature threshold value (see FIG. 3, block B2). In one exemplary embodiment, the temperature threshold value may depend on a chip temperature measured outside the active region of the semiconductor switch (cf. FIG. 1, temperature $T_A$).

Figure 3:
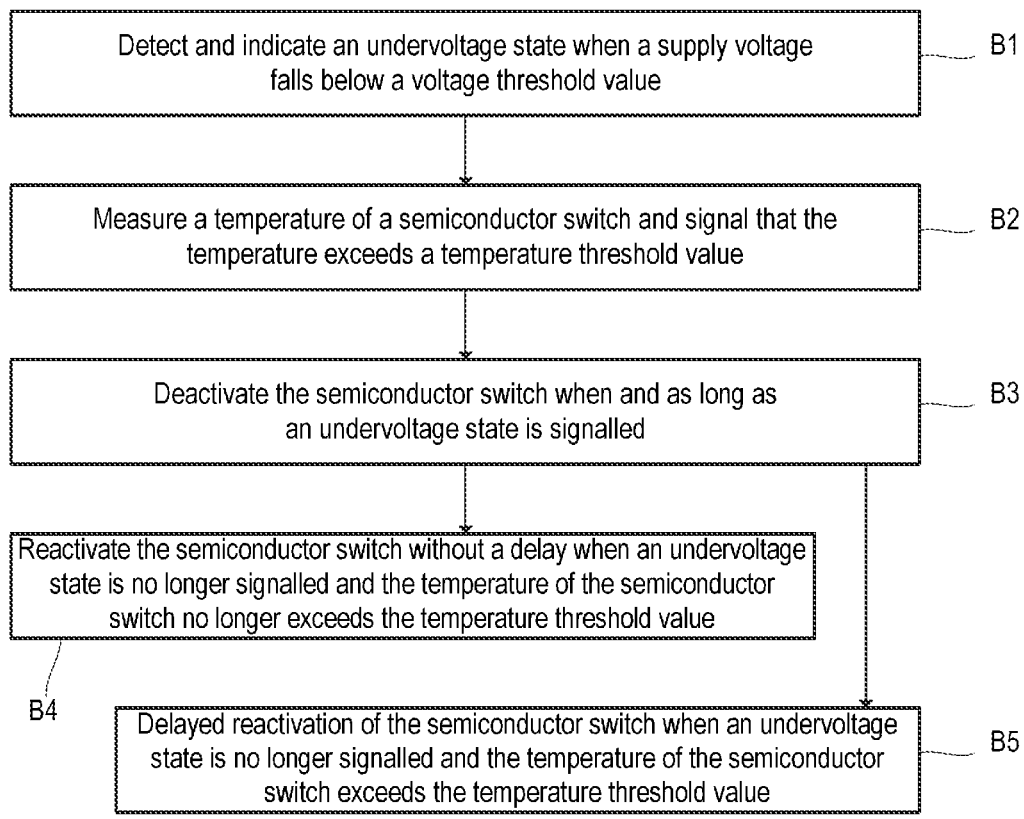
FIG. 3 is a flowchart for visualizing a method according to one exemplary embodiment.

The semiconductor switch is deactivated as soon as an undervoltage state is indicated, and it remains deactivated as long as the undervoltage state is indicated (see FIG. 3, block B3). In the example explained above with reference to FIG. 2, ON=0 (semiconductor switch off) results directly from UV=1 (undervoltage state detected).

Reactivation following undervoltage-induced deactivation of the semiconductor switch takes place automatically (that is to say by way of the control circuit without an external trigger) when an undervoltage state is no longer indicated (UV=0), wherein the semiconductor switch is reactivated without a delay when the temperature of the semiconductor switch does not exceed the temperature threshold value (see FIG. 3, block B4), or the semiconductor switch is reactivated with a delay when the temperature of the semiconductor switch exceeds the temperature threshold value (see FIG. 3, block B5). In other words: provided that the deactivation took place due to an undervoltage and the undervoltage state is no longer present, the semiconductor switch is reactivated with or without a delay depending on the condition $T_J>T_{TH}$, wherein the threshold value $T_{TH}$ does not necessarily have to be constant (for example $T_{TH}=T_A+\Delta T$).

In one exemplary embodiment, the method comprises activating and deactivating the semiconductor switch (see FIG. 1, MOS transistors $T_L$) in accordance with an input signal $S_{IN}$, wherein the activation takes place without the insertion of the delay time when the input signal $S_{IN}$ signals the activation of the semiconductor switch (change from $S_{IN}=0$ to $S_{IN}=1$). In this regard, it may be established that, when the semiconductor switch is activated due to a change from $S_{IN}=0$ to $S_{IN}=1$, the previous deactivation did not take place due to an undervoltage, but rather due to a change from $S_{IN}=1$ to $S_{IN}=0$.

The method summarized above is generally performed by a control circuit. Since the insertion of the mentioned delay requires the deactivation of the semiconductor switch to have taken place due to an undervoltage, the control circuit, according to one exemplary embodiment, has a storage element that is configured to store a detected undervoltage state (cf. FIG. 2, flip-flop 101, signal UVL). The control circuit is furthermore configured to erase information stored in the storage element ("undervoltage detected") at the latest when the semiconductor switch is reactivated. In the example discussed above with reference to FIG. 2, the memory is erased by resetting the flip-flop when the semiconductor switch is reactivated. Depending on the actual implementation, this resetting may even also take place somewhat earlier.

In some exemplary embodiments, instead of a counter, another delay element, for example a monoflop, may be used. In this case, the delay time is determined by the properties of the monoflop (for example by a time constant RC), and not by a clock frequency.

Figure 4:
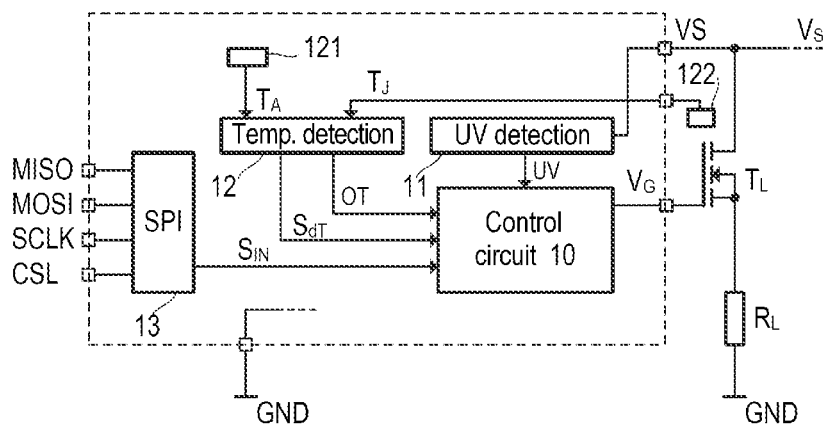
FIG. 4 illustrates, as an alternative to the smart semiconductor switch from FIG. 1, a control circuit for driving a transistor according to one exemplary embodiment.

FIG. 4 illustrates, as an alternative to the smart semiconductor switch from FIG. 1, an integrated circuit for driving a transistor (control chip) according to one exemplary embodiment. Unlike the circuit arrangement from FIG. 1, the power transistor $T_L$ is not jointly integrated into the control chip, but rather is an external component. The temperature sensor 122 is also an external circuit (from the point of view of the control chip). The temperature sensor may for example generate a current that represents the temperature $T_J$, and this current is supplied to a pin of the control chip. The concept described above of the undervoltage deactivation and the insertion of a delay time before the reactivation depending on the temperature $T_J$ (or the differential temperature $T_J-T_A$) may also be applied in the example from FIG. 4. The exemplary embodiments described here are independent of whether the electronic switch $T_L$ is integrated in the same chip or chip housing as the circuit for driving it.

The circuit arrangement from FIG. 4 is additionally configured to permanently deactivate the electronic switch $T_L$ when the measured temperature $T_J$ exceeds a permissible maximum value $T_{MAX}$ (overtemperature signal OT=1, when $T_J>T_{MAX}$). In this connection, "permanently deactivate" means that automatic reactivation does not take place when the temperature drops again, but rather the reactivation has to be triggered for example by an external controller. Without this external trigger, the electronic switch remains off. This feature may also be applied to the example from FIG. 1.

The example from FIG. 4 contains a digital communication interface 13, which is designed for example as a serial peripheral interface (SPI). The communication interface 13 allows the circuit arrangement to receive control commands. These control commands may comprise for example an activation command and a deactivation command, and possibly also a reactivation command following an overtemperature deactivation (signal OT=1). In the illustrated example, the communication interface 13 is configured to generate the signal $S_{IN}$ in response to the receipt of an activation command ($S_{IN}=1$) or a deactivation command ($S_{IN}=0$). A storage element (flip-flop), which stores the overtemperature state (OT=1), may for example be erased in response to a reactivation command following an overtemperature deactivation.

It goes without saying that SPI is just one example of a suitable digital communication interface. A CAN interface or a LIN interface, for example, may be considered as an alternative. However, a large number of other bus interfaces are also suitable (for example I2C, RS-232, etc.). The chip pins MOSI, MISO, SCLK and CSL illustrated in FIG. 4 are typical for SPI (MISO=Master in—Slave out, MOSI=Master out—Slave in, SCLK=Serial Clock, CSL=Chip Select). These designations are known to a person skilled in the art and are therefore not discussed further. Many customary microcontrollers have an integrated SPI and may be connected directly to the MISO and MOSI connections of the circuit arrangement from FIG. 4.

What is claimed is:

1. A circuit arrangement, comprising:
   an undervoltage detection circuit that is configured to indicate an undervoltage state when a supply voltage falls below a voltage threshold value;
   a temperature detection circuit that is configured to indicate that a temperature of a semiconductor switch exceeds a temperature threshold value; and
   a control circuit for driving the semiconductor switch configured to:
      deactivate the semiconductor switch when the undervoltage detection circuit indicates the undervoltage state, and
      reactivate the semiconductor switch when the undervoltage detection circuit no longer indicates the undervoltage state, wherein, when the temperature detection circuit indicates that the temperature of the semiconductor switch exceeds the temperature threshold value, reactivation of the semiconductor switch is delayed by a defined delay time after the control circuit deactivates the semiconductor switch due to the undervoltage state, wherein the control circuit has a storage element that is configured to store the indicated undervoltage state.

2. The circuit arrangement according to claim 1, wherein, when the temperature detection circuit does not indicate that the temperature of the semiconductor switch exceeds the temperature threshold value, the reactivation is not delayed by the defined delay time after the control circuit deactivates the semiconductor switch due to the undervoltage state.

3. The circuit arrangement according to claim 1, wherein the control circuit is further configured to activate and deactivate the semiconductor switch in accordance with an input signal.

4. The circuit arrangement according to claim 1, wherein the control circuit is configured to erase information stored in the storage element when the semiconductor switch is reactivated or prior to the semiconductor switch being reactivated.

5. The circuit arrangement according to claim 1, wherein the storage element is an SR latch, and wherein the control circuit is configured to set the SR latch when the supply voltage falls below the voltage threshold value, and to reset the SR latch when the semiconductor switch is reactivated.

6. The circuit arrangement according to one of claim 1, wherein the control circuit has a delay element that determines the defined delay time.

7. The circuit arrangement according to claim 6, wherein the delay element is a counter.

8. The circuit arrangement of claim 1, further comprising the semiconductor switch.

9. The circuit arrangement of claim 8, wherein the semiconductor switch, the undervoltage detection circuit, the temperature detection circuit, and the control circuit are disposed on a single semiconductor chip.

10. The circuit arrangement of claim 8, further comprising a temperature sensor coupled to the temperature detection circuit, wherein:
the undervoltage detection circuit, the temperature detection circuit and the control circuit are disposed on a single semiconductor chip; and
the semiconductor switch and the temperature sensor are external to the single semiconductor chip.

11. A smart semiconductor switch, comprising:
a semiconductor switch integrated in a semiconductor chip; and
a circuit arrangement integrated in the semiconductor chip and coupled to the semiconductor switch, the circuit arrangement including:
an undervoltage detection circuit that is configured to indicate an undervoltage state when a supply voltage falls below a voltage threshold value;
a temperature detection circuit that is configured to indicate that a temperature of the semiconductor switch exceeds a temperature threshold value; and
a control circuit for driving the semiconductor switch configured to:
deactivate the semiconductor switch when the undervoltage detection circuit indicates the undervoltage state, and
reactivate the semiconductor switch when the undervoltage detection circuit no longer indicates the undervoltage state,
wherein, when the temperature detection circuit indicates that the temperature of the semiconductor switch exceeds the temperature threshold value, reactivation is delayed by a defined delay time after the control circuit deactivates the semiconductor switch due to the undervoltage state, and
wherein the control circuit includes a storage element to store the indicated undervoltage state.

12. The smart semiconductor switch according to claim 11, wherein the semiconductor switch comprises a transistor.

13. The smart semiconductor switch according to claim 12, wherein the transistor comprises one of a field-effect transistor and an insulated-gate bipolar transistor (IGBT).

14. The smart semiconductor switch according to claim 11,
wherein, when the temperature detection circuit does not indicate that the temperature of the semiconductor switch exceeds the temperature threshold value, the reactivation is not delayed by the defined delay time after the control circuit deactivates the semiconductor switch due to the undervoltage state.

15. The smart semiconductor switch according to claim 11,
wherein the control circuit is further configured to activate and deactivate the semiconductor switch in accordance with an input signal.

16. The circuit arrangement according to claim 11,
wherein the control circuit erases the indicated undervoltage state stored in the storage element either before the semiconductor switch is reactivated or when the semiconductor switch is reactivated.

17. A method, comprising:
detecting and indicating an undervoltage state when a supply voltage falls below a voltage threshold value;
measuring a temperature of a semiconductor switch and signalling when a measured temperature of the semiconductor switch exceeds a temperature threshold value;
deactivating the semiconductor switch when the undervoltage state is indicated;
reactivating the semiconductor switch when the undervoltage state is no longer indicated;
delaying the reactivating by a defined delay time when the semiconductor switch was previously deactivated due to the indicated undervoltage state and the signalling indicates that the measured temperature of the semiconductor switch exceeds the temperature threshold value;
storing the detected and indicated undervoltage state; and
erasing the stored detected and indicated undervoltage state prior to the semiconductor switch being reactivated or when the semiconductor switch is reactivated.

18. The method according to claim 17,
wherein the reactivating takes place without the defined delay time when the semiconductor switch was previously deactivated due to the detected and indicated undervoltage state and the signalling indicates that the temperature of the semiconductor switch does not exceed the temperature threshold value.

19. The method according to claim 17, further comprising:
reactivating and deactivating the semiconductor switch in accordance with an input signal.

20. The method according to claim 17,
wherein storing the detected and indicated undervoltage state comprises storing the detected and indicated undervoltage state in an SR latch; and
wherein erasing the stored detected and indicated undervoltage state comprises resetting the SR latch.

* * * * *